United States Patent
Zhang

(10) Patent No.: US 11,715,548 B2
(45) Date of Patent: Aug. 1, 2023

(54) REPAIR CIRCUIT AND MEMORY

(71) Applicant: CHANGXIN MEMORY TECHNOLOGIES, INC., Hefei (CN)

(72) Inventor: Liang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 126 days.

(21) Appl. No.: 17/446,775

(22) Filed: Sep. 2, 2021

(65) Prior Publication Data
US 2022/0122688 A1 Apr. 21, 2022

Related U.S. Application Data

(63) Continuation of application No. PCT/CN2021/100781, filed on Jun. 18, 2021.

(30) Foreign Application Priority Data

Oct. 20, 2020 (CN) .......................... 202011124159.6

(51) Int. Cl.
G11C 29/00 (2006.01)
G11C 29/44 (2006.01)

(52) U.S. Cl.
CPC ........ G11C 29/789 (2013.01); G11C 29/4401 (2013.01); G11C 29/76 (2013.01)

(58) Field of Classification Search
CPC .................................................. G11C 29/789
See application file for complete search history.

(56) References Cited

U.S. PATENT DOCUMENTS

| 9,349,491 B1* | 5/2016 | Morgan | G11C 29/88 |
|---|---|---|---|
| 11,309,057 B2* | 4/2022 | Nakamura | G11C 29/44 |
| 2003/0123301 A1 | 7/2003 | Jang | |
| 2003/0133334 A1 | 7/2003 | Ohtani | |
| 2005/0232036 A1 | 10/2005 | Choi | |
| 2011/0249480 A1 | 10/2011 | Cho | |

(Continued)

FOREIGN PATENT DOCUMENTS

| CN | 101377959 A | 3/2009 |
|---|---|---|
| CN | 102290104 A | 12/2011 |

(Continued)

OTHER PUBLICATIONS

Supplementary European Search Report in the European application No. 21876733.3, dated Oct. 27, 2022.

(Continued)

*Primary Examiner* — Min Huang
(74) *Attorney, Agent, or Firm* — Syncoda LLC; Feng Ma

(57) ABSTRACT

A repair circuit includes: a plurality of redundant memory cells, each redundant memory cell being configured with a state signal; and a repair module connected to the plurality of redundant memory cells and configured to determine target memory cells from the redundant memory cells based on the state signals and repair defective memory cells through the target memory cells. The target memory cells are in one-to-one correspondence to the defective memory cells. The repair module can repair, at each of multiple repair stages, different defective memory cells, the plurality of redundant memory cells being shared at the multiple repair stages.

16 Claims, 6 Drawing Sheets

(56) References Cited

U.S. PATENT DOCUMENTS

| | | | |
|---|---|---|---|
| 2014/0241084 A1* | 8/2014 | Pan | G11C 29/808 365/200 |
| 2016/0372214 A1 | 12/2016 | Shim | |
| 2017/0200512 A1 | 7/2017 | Lee | |
| 2018/0102185 A1* | 4/2018 | Yang | G11C 29/78 |
| 2018/0308563 A1 | 10/2018 | You | |
| 2020/0243158 A1* | 7/2020 | Wilson | G11C 29/76 |
| 2022/0005544 A1* | 1/2022 | Zhang | G11C 29/804 |
| 2022/0084621 A1* | 3/2022 | Zhang | G11C 29/4401 |
| 2022/0101941 A1* | 3/2022 | Kim | G11C 29/4401 |

FOREIGN PATENT DOCUMENTS

| | | |
|---|---|---|
| CN | 106257595 A | 12/2016 |
| CN | 107017029 A | 8/2017 |
| CN | 107148650 A | 9/2017 |
| CN | 108182962 A | 6/2018 |
| CN | 110400584 A | 11/2019 |

OTHER PUBLICATIONS

International Search Report in the international application No. PCT/CN2021/100781, dated Sep. 23, 2021.

* cited by examiner

REPAIR CIRCUIT AND MEMORY

CROSS-REFERENCE TO RELATED APPLICATIONS

The present application is a continuation of International Application No. PCT/CN2021/100781 filed on Jun. 18, 2021, which claims priority to Chinese Patent Application No. 202011124159.6 filed on Oct. 20, 2020. The disclosures of these applications are hereby incorporated by reference in their entirety.

BACKGROUND

A semiconductor memory is a memory that accesses through semiconductor circuits, and is widely applied to various fields because of its high memory speed and high integration. To obtain higher flexibility and reliability, a certain number of redundant memory cells are usually arranged in the memory to replace damaged normal memory cells.

SUMMARY

Embodiments of present application relate to a repair circuit and a memory.

According to a first aspect of various embodiments, the present application provides a repair circuit, which includes a plurality of redundant memory cells and a repair component.

Each of the plurality of redundant memory cells is configured with a state signal.

The repair component is connected to the plurality of redundant memory cells and is configured to determine target memory cells from the plurality of redundant memory cells based on a plurality of state signals and repair defective memory cells through the target memory cells.

The target memory cells are in one-to-one correspondence to the defective memory cells. The repair component is configured to repair, at each of a plurality of repair stages, a different one or more of the defective memory cells, and the plurality of redundant memory cells are shared at the plurality of repair stages.

According to a second aspect of various embodiments, the present application provides a memory, which includes a plurality of normal memory cells and the repair circuit.

The repair circuit is connected to the plurality of normal memory cells respectively.

The normal memory cells with an abnormal operation state are the defective memory cells.

Details of one or more embodiments of the present application are set forth in the following description and drawings. Other features and advantages of the present application will become apparent from the description, the drawings, and the claims.

BRIEF DESCRIPTION OF THE DRAWINGS

In order to more clearly describe the technical solutions of the embodiments of the present application and of the related art, drawings that need to be used in the embodiments and the related art will be briefly described below. It is apparent that the drawings in the following description are only some embodiments of the present application, from which other drawings may be acquired by those of ordinary skill in the art without paying any creative work.

Figure 1:
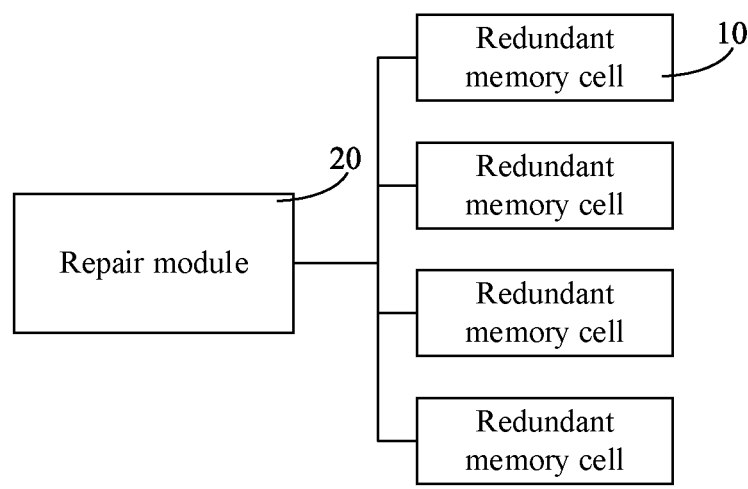
FIG. 1 is a structural schematic diagram of a repair circuit in a first embodiment.

DESCRIPTION OF REFERENCE NUMERALS OF ELEMENTS redundant memory cell: 10; first redundant memory cell: 11; second redundant memory cell: 12; third redundant memory cell: 13; fourth redundant memory cell: 14; repair module: 20; selection unit: 100; generation circuit: 110; first generation circuit: 111; second generation circuit: 112; third generation circuit: 113; fourth generation circuit: 114; first logic gate: 1101; second logic gate: 1102; memory repair unit: 200; first repair unit: 210; and detection module: 30.

DETAILED DESCRIPTION

Embodiments of the present application will be described more comprehensively with reference to accompanying drawings assist in the understanding of the present application. The preferred embodiment of the present application is shown in the accompanying drawings. However, the embodiments of the present application may be implemented in many different forms and should not be construed as limited to the embodiments set forth herein. Rather, the purpose of providing these embodiments is to make the disclosure of the embodiments of the present application more thorough and comprehensive.

Unless otherwise defined, all technical and scientific terms used herein have the same meaning as commonly understood by those of ordinary skill in the art to which the embodiments of the present application belong. The terms used in the present application are only for describing specific implementation purposes, and are not intended to limit the scope of the present application. The terms "and/or" used herein include any and all combinations of one or more related listed items.

In the descriptions of the embodiments of the present application, it is to be understood that orientation or position relationships indicated by terms "upper", "lower", "vertical", "horizontal", "inner", "outer", "circumferential" and the like are orientation or position relationships shown in the drawings, are adopted not to indicate or imply that indicated devices or components must be in specific orientations or structured and operated in specific orientations but only to conveniently describe the embodiments of the present application and simplify descriptions and thus should not be understood as limits to the embodiments of the present application.

With an increasing number of normal memory cells, the number of existing redundant memory cells cannot meet repair needs of a memory, resulting in low repair rate of defective memory cells.

FIG. 1 is a structural schematic diagram of a repair circuit in a first embodiment. The repair circuit in the embodiment of the present application is configured to repair the defective memory cells in the memory. The memory may be a Dynamic Random-Access Memory (DRAM) or a Static Random-Access Memory (SRAM) and the like. The memory includes a plurality of normal memory cells, each normal memory cell being capable of storing data, thus realizing the memory function of the memory with the plurality of normal memory cells.

However, it can be understood that in the processes of manufacturing and using the memory, there may be various conditions such as a poor manufacturing process or device aging, which may cause abnormal operation states of the normal memory cells. The abnormality in the operation states may include inability to write in data, inability to correctly read the written data, and the like. With the above problems, the normal memory cells may be regarded as defective memory cells. The defective memory cells cannot realize the access function, and thus need to be repaired through the repair circuit. Moreover, even if the normal memory cells are in a normal operation state when delivery, they might be damaged in the subsequent using process and thus turned into the defective memory cells. That is, multiple repair stages need to be arranged for repairing different original and newly-generated defective memory cells, so that operation efficiency and read-write accuracy of the memory are improved. In the embodiment, with reference to FIG. 1, the repair circuit includes a repair module 20 (implemented by, e.g., a repair component) and a plurality of redundant memory cells 10.

Each of the multiple redundant memory cells 10 is configured with a state signal. The state signal carries occupation information of the corresponding redundant memory cell 10, i.e., the state signal corresponds to the occupation information of the redundant memory cell 10, the occupation information including occupation and non-occupation. Occupation refers to repairing the defective memory cell through the redundant memory cell 10. Non-occupation refers to replacing the defective memory cell with the redundant memory cell 10 to execute a data reading-writing function, while the defective memory cell is still assigned with the original address, and does not need to execute the reading-writing operation. When there is a defective memory cell, the defective memory cell can be replaced with a redundant memory cell 10 through a repair process, and is thus repaired. After the defective memory cell is repaired, the data to be stored into the defective memory cell is stored into the redundant memory cell 10, and therefore, the data in the defective memory cell are read from the corresponding redundant memory cell 10 as needed.

Illustratively, the repair may include row repair and/or column repair. The row repair refers to replacing a row address corresponding to the defective memory cell with a row address of the redundant memory cell 10. The column repair refers to replacing a column address of the defective memory cell with a column address of the redundant memory cell 10.

Moreover, there is a one-to-one mapping relationship when the redundant memory cell 10 repairs the defective memory cell, i.e., each redundant memory cell 10 can only repair one defective memory cell at most. As a result, the unoccupied redundant memory cell 10 may be conveniently searched in the repair process by marking occupation information of the redundant memory cell 10. Illustratively, if one redundant memory cell 10 has been used to repair a defective memory cell, occupation information of the redundant memory cell 10 is occupation and the corresponding state signal may be 0.

Further, the normal memory cell and the redundant memory cell 10 are manufactured simultaneously, i.e., the redundant memory cell 10 has a hardware structure which is the same as that of the normal memory cell. Moreover, only a small number of redundant memory cells 10 are usually arranged in the memory as occurrence probability of the defective memory cell is low. The number of the redundant memory cells 10 is in direct proportion to the number of the normal memory cells and is in inverse proportion to a yield of a manufacturing process. That is, the larger the number of the normal memory cells, the higher the yield of the manufacturing process, and the more redundant memory cells 10 that need to be arranged.

The repair module 20 is connected to the plurality of redundant memory cells 10, and is configured to determine target memory cell(s) from the plurality of redundant memory cells 10, and repair the defective memory cell(s) through the target memory cell(s). Further, the repair module 20 can repair different defective memory cells respectively at multiple repair stages, the plurality of redundant memory cells 10 being shared at the multiple repair stages. In an existing memory, a redundant memory cell 10 is arranged correspondingly in each repair stage, i.e., each redundant memory cell 10 can only be used at a set repair stage, which causes a low utilization rate of the redundant memory cell 10 and further results in a low repair rate of the defective memory cell.

Illustratively, if the memory is configured with two repair stages which are respectively a first repair stage and a second repair stage, one defective memory cell needs to be repaired at the first repair stage, and three defective memory cells need to be repaired at the second repair stage. If the existing repair way is adopted and two redundant memory cells 10 are arranged at each repair stage, only two defective memory cells can be repaired at the second repair stage, i.e., the defective memory cells cannot be completely repaired. If a way of sharing the plurality of redundant memory cells 10 at multiple repair stages in the embodiments of the present application is adopted, four redundant memory cells 10 in total are arranged, and all defective memory cells can be repaired. In such a manner, the repair rate and the repair flexibility on the defective memory cells are improved. A repair circuit with higher repair flexibility and higher reliability is provided, so that reading-writing accuracy of the memory is improved.

In the embodiment, the repair circuit includes: a plurality of redundant memory cells 10, each redundant memory cell being configured with a status signal; and a repair module which is connected to the redundant memory cells 10 and is configured to determine target memory cells from the redundant memory cells 10 based on the state signals and repair defective memory cells through the target memory cells. The target memory cells are in one-to-one correspondence to the defective memory cells. The repair module 20 can repair different defective cells respectively at multiple repair stages, the plurality of redundant memory cells 10 being shared at the multiple repair stages. In response to the state signals of the redundant memory cells 10, the target memory cells are selected and the redundant memory cells 10 are shared at the multiple repair stages, and therefore, the repair rate and the repair flexibility on the defective memory cells are improved, i.e., a repair circuit with higher repair flexibility and higher reliability is provided.

Further, the multiple repair stages include a first repair stage and a second repair stage, and the memory repair units 200 include a first repair unit 210 and a second repair unit. The first repair unit 210 is connected to both the selection unit 100 and the plurality of redundant memory cells 10, and is configured to repair the defective memory cells at the first repair stage. The second repair unit is connected to both the selection unit 100 and the plurality of redundant memory cells 10, and is configured to repair the defective memory cells at the second repair stage. The first repair stage is earlier than the second repair stage, and the first repair unit 210 occupies the redundant memory cells 10 prior to the second repair unit. Still further, the first repair stage is a repair stage after encapsulation, and the second repair stage is a self repair stage. It can be understood that three or more repair stages can be further arranged and more repair units can be correspondingly arranged to correspond to the different repair stages one by one according to the repair needs. In such a manner, more accurate and comprehensive repair is provided to further improve the reliability and the stability of the memory.

Figure 2:
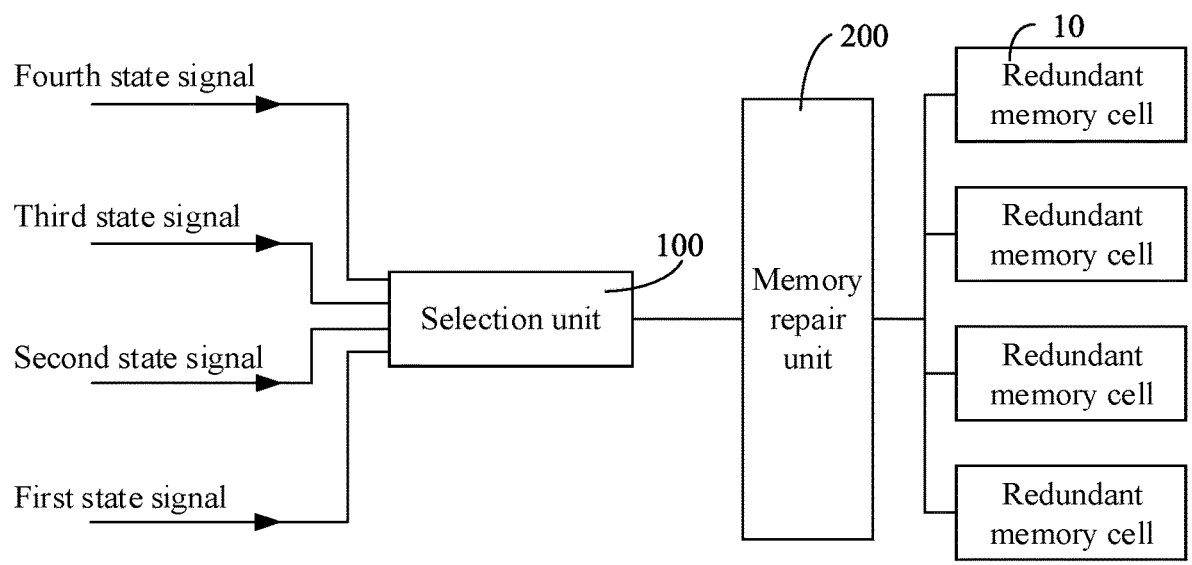
FIG. 2 is a structural schematic diagram of a repair circuit in a second embodiment.

FIG. 2 is a schematic structural diagram of a repair circuit in a second embodiment. In the embodiment with reference to FIG. 2, the repair circuit includes a repair module 20 and a plurality of redundant memory cells 10. The repair module 20 includes a selection unit 100 and a memory repair unit 200.

The selection unit 100 is configured to generate one or more unit selection signals according to the plurality of state signals. Specifically, the selection unit 100 can be a digital logic circuit, i.e., the selection unit 100 may include a plurality of logic gates. The plurality of logic gates perform logic operation according to input state signals, so that the unit selection signals are generated. The number of the state signals is the same as the number of the redundant memory cells 10, and are in one-to-one correspondence to the redundant memory cells 10. Illustratively, if four redundant memory cells 10 are arranged, the selection unit 100 receives four state signals and perform logic operation on the four state signals.

The memory repair unit 200 is connected to the selection unit 100 and the plurality of redundant memory cells, and is configured to receive the unit selection signals, determine the target memory cells according to the unit selection signals, and repair the defective memory cells through the target memory cells.

In some embodiments, the unit selection signal may only include one signal which can serially output multi-bit data. The memory repair unit 200 may determine an unoccupied redundant memory cell 10 according to the received multi-bit data, so that the defective memory cells are repaired. Illustratively, taking the repair circuit including four redundant memory cells 10 as an example, the unit selection signal may include two-bit data. If the unit selection signal is "00", the first redundant memory cell 11 is selected; if the unit selection signal is "01", the second redundant memory cell 12 is selected; if the unit selection signal is "10", the third redundant memory cell 13 is selected; and if the unit selection signal is "10", the fourth redundant memory cell 14 is selected. By adopting the above signal transmission way of outputting multi-bit data in the serial mode, a relatively simple hardware structure and fewer devices are needed, and thus is more suitable for a memory with a small size and low requirements on data reading-writing speed.

In other embodiments, the unit selection signal may include a plurality of enabling signals which are in one-to-one correspondence to the plurality of redundant memory cells 10, and at least one enabling signal is enabled at the same time. The selection unit 100 includes a plurality of generation circuits 110, each generation circuit 110 being configured to correspondingly generate an enabling signal.

The memory repair unit 200 is configured to determine the redundant memory cell 10 corresponding the enabled enabling signal as the target memory cell. Illustratively, taking the repair circuit including four redundant memory cells 10 as an example, when the enabling signals are enabled at a high level, if the plurality of enabling signals include three low-level signals and a high-level signal, the redundant memory cell 10 corresponding to the high-level signal is selected as the target memory cell for repairing the defective memory cell. In the embodiment, a way of adopting a plurality of signals for synchronous calculation and transmission is higher in operation rate, and is thus more suitable for a memory with a large number of memory cells, large data volume and higher requirements on data reading-writing speed.

Further, the selection unit 100 is configured to generate the unit selection signals according to a preset repair sequence and the plurality of state signals. The redundant memory cell 10 in a first repair sequence is defined as a first redundant memory cell 11, the redundant memory cell 10 in a second repair sequence is defined as a second redundant memory cell 12, and so on. According to the preset sequence, when at least one of all redundant memory repair units 200 in front of the n-th redundant memory cell 10 in the repair sequence is unoccupied, the n-th enabling signal is disabled; and when all redundant memory repair units 200 in front of the n-th redundant memory cell 10 in the repair sequence are occupied and the n-th redundant memory cell 10 is unoccupied, the n-th enabling signal is enabled. For example, when the first redundant memory cell 11 or the second redundant memory cell 12 is unoccupied, the third enabling signal corresponding to the third redundant memory cell 13 is disabled; and when both the first redundant memory cell 11 and the second redundant memory cell 12 are occupied and the third redundant memory cell 13 is unoccupied, the corresponding third enabling signal is enabled.

Figure 3:
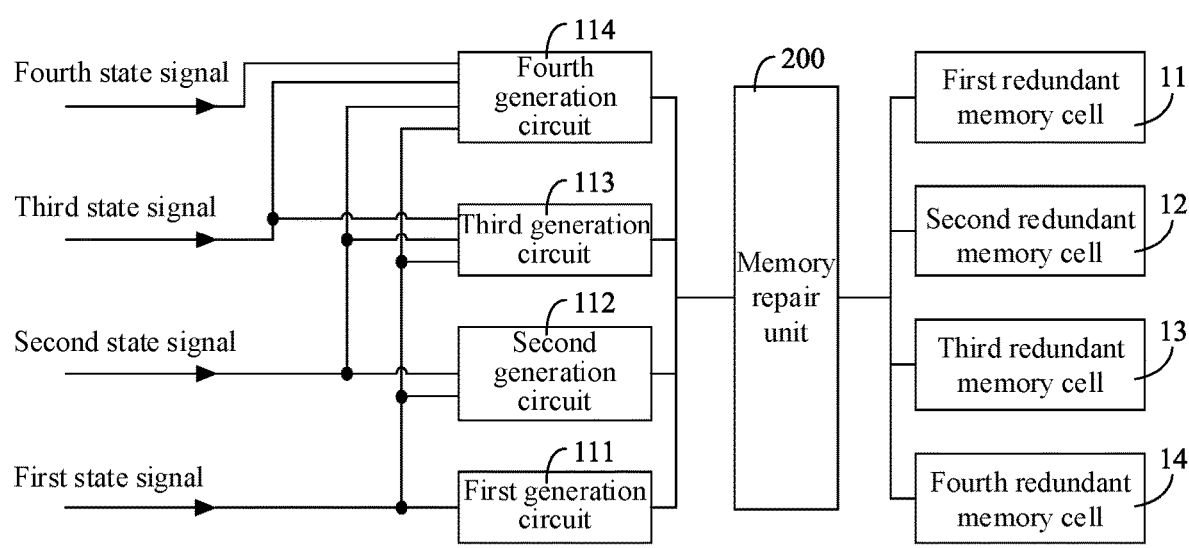
FIG. 3 is a structural schematic diagram of a repair circuit in a third embodiment.

Still further, the purpose of selecting a redundant repair unit according to the repair sequence can be realized through a circuit structure inside the selection unit 100, i.e., in the embodiment, the repair circuit can select a proper redundant repair unit to perform repairment without an external control signal. Specifically, FIG. 3 is a schematic structural diagram of a repair circuit in a third embodiment. In the embodiment, with reference to FIG. 3, the selection unit 100 includes a first generation circuit 111, the first generation circuit 111 being configured to a generate a first enabling signal. When the first redundant memory cell 11 is occupied, the first enabling signal is disabled. When the first redundant memory cell 11 is unoccupied, the first enabling signal is enabled. Illustratively, if the first state signal is at a high level, the first redundant memory cell 11 is unoccupied and the first enabling signal is enabled and is at the high level. In such a manner, a level state of the first enabling signal can follow a level state of the first state signal, i.e., a signal output from the first generation circuit 111 is the same with a signal input into the first generation circuit 111. As a result, an extra logic gate does not need to be arranged in the first generation circuit 111, so that the output function can be achieved with a simple hardware structure.

Figure 4:
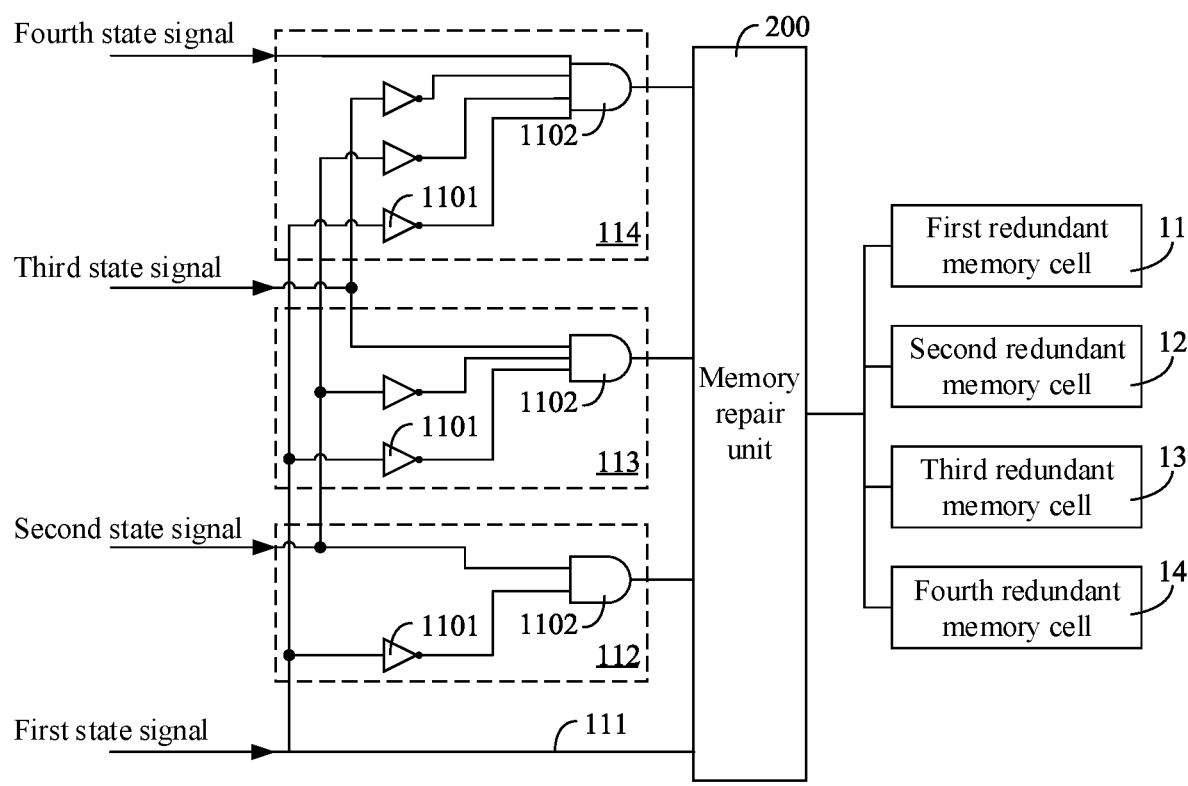
FIG. 4 is a structural schematic diagram of a repair circuit in a fourth embodiment.

In the embodiment, with continued reference to FIG. 3, the selection unit 100 further includes an n-th generation circuit 110, n being an integer greater than 1. Illustratively, in the embodiment as shown in FIG. 3, the selection unit 100 further includes a second generation circuit 112, a third generation circuit 113 and a fourth generation circuit 114. The n-th generation circuit 110 is configured to generate an n-th enabling signal, namely the n-th enabling signal being in one-to-one correspondence to the n-th generation circuit 110. FIG. 4 is a structural schematic diagram of a repair circuit in a fourth embodiment. In the embodiment, with reference to FIG. 4, the n-th generation circuit 110 includes a second logic gate 1102 and n−1 logic gates 1101.

The n−1 logic gates 1101 are configured to receive n−1 state signals in a one-to-one correspondence mode, and perform logic operation on the received state signals, the n−1 state signals being respectively a first state signal to a n−1-th state signal. Further, the first logic gates 1101 may be non-gates. Illustratively, taking the fourth generation circuit 114 as an example, the fourth generation circuit 114 includes three first logic gates 1101. The three first logic gates 1101 are respectively configured to receive a first state signal, a second state signal and a third state signal in the one-to-one correspondence mode, are NOT gates, and are further configured to output an inverted first state signal, an inverted second state signal and an inverted third state signal in the one-to-one correspondence mode.

The second logic gate 1102 is configured with n input ends and an output end. The n−1 input ends are respectively connected to the output ends of the n−1 first logic gates 1101 in the one-to-one correspondence mode, and the remaining input ends are configured to receive an n-th state signal. The second logic gate 1102 is configured to perform logic operation on the plurality of input signals to generate the n-th enabling signal. Further, the second logic gate 1102 may be an AND gate. Based on the description, the second logic gate 1102 in the fourth generation circuit 114 is configured with four input ends, among which three input ends are respectively configured to receive an inverted first state signal, an inverted second state signal and an inverted third state signal in one-to-one correspondence mode, and the remaining input end is configured to receive a fourth state signal. The second logic gate 1102 performs logic operation on the plurality of input signals to generate a fourth enabling signal.

It can be understood that the first logic gates 1101 in the embodiments of the present application are not limited to NOT gates, and the second logic gate 1102 is not limited to an AND gate. For example, a NOT gate can also be arranged in the first generation circuit 111, and the second logic gate 1102 can also be arranged as an NAND gate, and the memory repair unit is controlled to select and take the redundant memory cell 10 corresponding to the low-level enabling signal as the target memory cell to repair the defective memory cell. Therefore, the circuit structure selected and repaired according to the preset repair sequence can be achieved based on the plurality of enabling signals output by the selection unit 100, which belongs to the scope of protection of the present application, and is not limited to the structure of the selection unit 100 in the embodiments.

Figure 5:
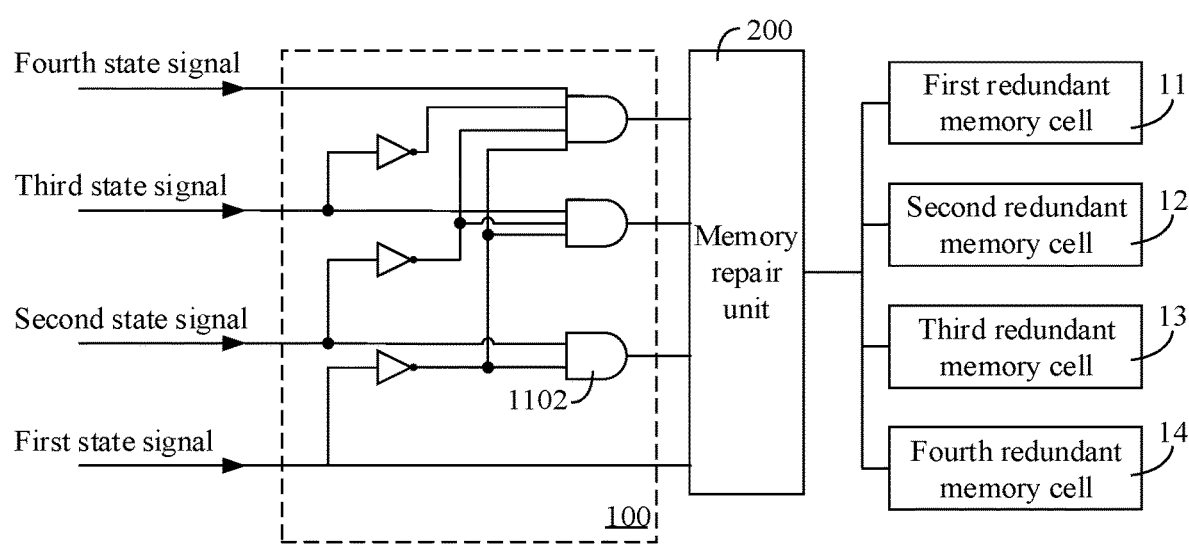
FIG. 5 is a structural schematic diagram of a repair circuit in a fifth embodiment.

In one embodiment, the plurality of generation circuits 110 share at least part of the first logic gates 1101. Specifically, FIG. 5 is a schematic structural diagram of a repair circuit in a fifth embodiment. In the embodiment with reference to FIG. 4 and FIG. 5, the plurality of logic gates of the same function can be shared. Illustratively, referring to FIG. 4, the second generation circuit 112, the third generation circuit 113 and the fourth generation circuit 114 are all required to receive an inverted first state signal, and correspondingly, a NOT gate is respectively arranged in each generation circuit 110 in the embodiment as shown in FIG. 4, and each NOT gate independently receives the first state signal and performs the inversing operation. In the embodiment as shown in FIG. 5, the first state signal is inverted firstly, and the inverted signal is transmitted to each second logic gate 1102. Namely, compared with the embodiment as shown in FIG. 4, the embodiment as shown in FIG. 5 achieves the same technical effect with fewer logic devices. In such a manner, a repair circuit with a simpler structure is provided, so that integration of the memory can be effectively improved. It can be understood that in other embodiments, only part of logic gates configured to realize the same function can be shared, and other part of the logic gates are not shared.

Figure 6:
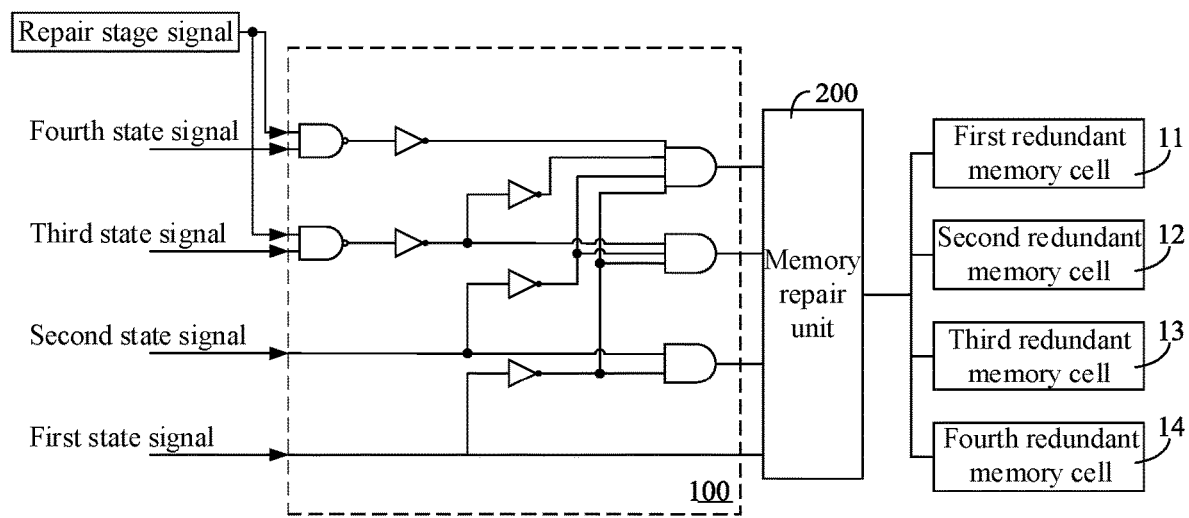
FIG. 6 is a structural schematic diagram of a repair circuit in a sixth embodiment.

FIG. 6 is a schematic structural diagram of a repair circuit in a fifth embodiment. In the embodiment with reference to FIG. 6, the selection unit 100 is further configured to receive a repair stage signal input from the outside, and outputs a unit selection signal according to the repair stage signal. Specifically, if the state signal is at a high level, the corresponding redundant memory cell 10 is unoccupied, and if the enabling signal in the unit selection signal is at a high level, the corresponding redundant memory cell 10 is selected to perform repairment. In the embodiment, if at least two redundant memory cells 10 need to be remained for repairing at the second repair stage, the repair stage signal can be controlled to be at a low level all the time at the first repair stage. After being computed by the selection unit 100, the third enabling signal and the fourth enabling signal are always at the low level, i.e., the third redundant memory cell 13 and the fourth redundant memory cell 14 cannot be occupied at the first repair stage. In such a manner, the purpose of remaining part of the redundant memory cells 10 is achieved, so that a more flexible repair circuit is achieved. In the embodiment, for another example, if only one redundant memory cell 10, for example only the first redundant memory cell 11 is used at the first repair stage, three redundant memory cells 10, for example the second redundant memory cell 12, the second redundant memory cell 13 and the second redundant memory cell 14, can be used at the second repair stage. That is, the first redundant memory cell 11, the second redundant memory cell 12, the second redundant memory cell 13 and the second redundant memory cell 14 are shared at the first repair stage and the second repair stage, so that a more flexible repair circuit is achieved.

In one embodiment, the repair circuit may further include a detection module 30 which is connected to a plurality of normal memory cells. The detection module 30 is configured to detect the operation states of the plurality of normal memory cells, and determine the defective memory cells from the plurality of normal memory cells according to the operation states.

Specifically, the detection module 30 is connected to the normal memory cells to test the connected normal memory cells in a test mode. Namely, when the memory is in the test mode, the detection module 30 performs a corresponding test function. The memory is switched to the test mode responsive to a test trigger signal. Illustratively, the memory can be switched to the test mode by firstly automatically generating the test trigger signal upon every power-on. The memory can also be switched to the test mode responsive to the test trigger signal input from the outside. The test trigger signal, for example, may be a signal input by a user via an electronic device connected to the memory. The memory may further be switched to the test mode responsive to the test trigger signal output from an internal controller. The controller can output the test trigger signal after being operated for a preset period every time, so as to implement regular monitoring of the normal memory cells. It can be understood that a responsive defect test may be arranged for each repair stage, and different test trigger signals can be arranged at different repair stages, to enable the detection module 30 to accurately distinguish different repair stages.

A defect test way can be as follows: the detection module 30 automatically generates one or more test data responsive to the test trigger signal, writes the test data into respective one or more to-be-tested memory cells, reads data from the memory cells after certain time, and compares the read data with the automatically generated test data to judge whether or not the memory function of the memory cell(s) is normal. If there is a difference between the data read from one memory cell and the data written into the memory cell, the memory cell is a defective memory cell.

The embodiment of the present application further provides a memory, which includes a repair circuit and a plurality of normal memory cells, the repair circuit being connected to the plurality of normal memory cells, the normal memory cells with the abnormal operation state being the defective memory cells. It can be understood that the specific structure of the repair circuit in the embodiment may refer to the above embodiments, and thus is not described repeatedly herein. The embodiment implements a memory with higher reliability and higher flexibility based on a repair circuit with a flexible repair function.

It should be noted that the repair module, the selection unit, the memory repair unit, the first repair unit, the second repair unit and the detection module may be implemented by corresponding circuits.

The technical features of the above embodiments can be combined arbitrarily. In order to make the description of these embodiments more concise, all possible combinations of the technical features therein are not described. However, as long as there is no contradiction in the combinations, all technical features should be considered to fall within the scope described in the description.

The above embodiments only express several implementation manners of the present application, and descriptions thereof are relatively specific and detailed, but should not be understood as limiting the scope of the disclosure. It should be noted that improvements and modifications made by those of ordinary skill in the art without departing from the concept of the present application shall fall within the protective scope of the present application. Therefore, the protective scope of the embodiments of present application shall be subject to the protective scope of the claims.

What is claimed is:

1. A repair circuit, comprising:
   a plurality of redundant memory cells, each of the plurality of redundant memory cells being configured with a state signal; and
   a repair component, connected to the plurality of redundant memory cells, and configured to determine target memory cells from the plurality of redundant memory cells based on a plurality of state signals and repair defective memory cells through the target memory cells,
   wherein the target memory cells are in one-to-one correspondence to the defective memory cells, the repair component is configured to repair, at each of a plurality of repair stages, a different one or more of the defective memory cells, and the plurality of redundant memory cells are shared at the plurality of repair stages;
   wherein the repair component comprises:
   a selection circuit, configured to generate unit selection signals according to the plurality of state signals; and
   a memory repair circuit, connected to both the selection circuit and the plurality of redundant memory cells, and configured to receive the unit selection signals, determine the target memory cells according to the unit selection signals, and repair the defective memory cells through the target memory cells;
   wherein the unit selection signals comprise a plurality of enabling signals which are in one-to-one correspondence to the plurality of redundant memory cells, and at most one of the plurality of enabling signals is enabled at the same time;
   wherein the selection circuit comprises a plurality of generation circuits, each of the plurality of generation circuits being configured to generate a respective one of the plurality of enabling signals, and
   wherein the memory repair circuit is configured to determine a redundant memory cell corresponding to the enabled enabling signal as a target memory cell.

2. The repair circuit of claim 1, wherein the selection circuit is configured to generate the unit selection signals according to a preset repair sequence and the plurality of state signals.

3. The repair circuit of claim 1, wherein the state signal carries occupation information of the redundant memory cell corresponding to the state signal, the occupation information comprises occupation and non-occupation, the selection circuit comprises a first generation circuit configured to generate a first enabling signal and define a redundant memory cell in a first repair sequence as a first redundant memory cell,
   wherein when the first redundant memory cell is occupied, the first enabling signal is disabled; and
   when the first redundant memory cell is unoccupied, the first enabling signal is enabled.

4. The repair circuit of claim 1, wherein a redundant memory cell in an n-th repair sequence is defined as an n-th redundant memory cell, n being a positive integer greater than 1, and the selection circuit further comprises an n-th generation circuit configured to generate an n-th enabling signal, wherein
   when at least one of all the redundant memory repair circuits in front of the n-th redundant memory cell in the repair sequence is occupied, the n-th enabling signal is disabled; and
   when all the redundant memory repair cells in front of the n-th redundant memory cell in the repair sequence are occupied and the n-th redundant memory cell is unoccupied, the n-th enabling signal is disabled.

5. The repair circuit of claim 4, wherein the n-th generation circuit comprises:
   n−1 first logic gates, configured to receive n−1 state signals in a one-to-one correspondence mode, and perform logic operation on the received state signals; and
   a second logic gate, configured with n input ends and an output end, wherein the n−1 input ends are connected to the output ends of the n−1 first logic gates in the one-to-one correspondence mode, an input end other than the n−1 input ends is configured to receive an n-th state signal, and the second logic gate is configured to perform logic operation on the plurality of input signals to generate the n-th enabling signal.

6. The repair circuit of claim 5, wherein the first logic gates are NOT gates, and the second logic gate is an AND gate.

7. The repair circuit of claim 5, wherein the plurality of generation circuits share at least one of the first logic gates.

8. The repair circuit of claim 1, wherein the plurality of repair stages comprise a first repair stage and a second repair stage, and the memory repair circuits comprises:
- a first repair circuit, connected to both the selection circuit and the plurality of redundant memory cells, and configured to repair the defective memory cells at the first repair stage; and
- a second repair circuit, connected to both the selection circuit and the plurality of redundant memory cells, and configured to repair the defective memory cells at the second repair stage;
- wherein the first repair stage is earlier than the second repair stage, and the first repair circuit occupies the redundant memory cell prior to the second repair circuit.

9. The repair circuit of claim 8, wherein the first repair stage is a repair stage after encapsulation, and the second repair stage is a self repair stage.

10. The repair circuit of claim 1, further comprising:
- a detection circuit, connected to the plurality of normal memory cells, and configured to detect operation states of the plurality of normal memory cells, and determine the defective memory cells from the plurality of normal memory cells according to the operation states.

11. The repair circuit of claim 1, wherein the selection circuit is further configured to receive a repair stage signal input from outside and output the unit selection signals according to the repair stage signal.

12. A memory, comprising:
- a plurality of normal memory cells; and
- a repair circuit, connected to the plurality of normal memory cells,
- wherein the normal memory cells with an abnormal operation state are taken the defective memory cells, wherein the repair circuit comprises:
- a plurality of redundant memory cells, each of the plurality of redundant memory cells being configured with a state signal; and
- a repair component, connected to the plurality of redundant memory cells, and configured to determine target memory cells from the plurality of redundant memory cells based on a plurality of state signals and repair defective memory cells through the target memory cells,
- wherein the target memory cells are in one-to-one correspondence to the defective memory cells, the repair component is configured to repair, at each of a plurality of repair stages, a different one or more of the defective memory cells, and the plurality of redundant memory cells are shared at the plurality of repair stages;
- wherein the repair component comprises:
- a selection circuit, configured to generate unit selection signals according to the plurality of state signals; and
- a memory repair circuit, connected to both the selection circuit and the plurality of redundant memory cells, and configured to receive the unit selection signals, determine the target memory cells according to the unit selection signals, and repair the defective memory cells through the target memory cells;
- wherein the unit selection signals comprise a plurality of enabling signals which are in one-to-one correspondence to the plurality of redundant memory cells, and at most one of the plurality of enabling signals is enabled at the same time;
- wherein the selection circuit comprises a plurality of generation circuits, each of the plurality of generation circuits being configured to generate a respective one of the plurality of enabling signals, and
- wherein the memory repair circuit is configured to determine a redundant memory cell corresponding to the enabled enabling signal as a target memory cell.

13. The memory of claim 12, wherein the selection circuit is configured to generate the unit selection signals according to a preset repair sequence and the plurality of state signals.

14. The memory of claim 12, wherein the state signal carries occupation information of the redundant memory cell corresponding to the state signal, the occupation information comprises occupation and non-occupation, the selection circuit comprises a first generation circuit configured to generate a first enabling signal and define a redundant memory cell in a first repair sequence as a first redundant memory cell,
- wherein when the first redundant memory cell is occupied, the first enabling signal is disabled; and
- when the first redundant memory cell is unoccupied, the first enabling signal is enabled.

15. The memory of claim 14, wherein a redundant memory cell in an n-th repair sequence is defined as an n-th redundant memory cell, n being a positive integer greater than 1, and the selection circuit further comprises an n-th generation circuit configured to generate an n-th enabling signal, wherein
- when at least one of all the redundant memory repair circuits in front of the n-th redundant memory cell in the repair sequence is occupied, the n-th enabling signal is disabled; and
- when all the redundant memory repair cells in front of the n-th redundant memory cell in the repair sequence are occupied and the n-th redundant memory cell is unoccupied, the n-th enabling signal is disabled.

16. The memory of claim 15, wherein the n-th generation circuit comprises:
- n−1 first logic gates, configured to receive n−1 state signals in a one-to-one correspondence mode, and perform logic operation on the received state signals; and
- a second logic gate, configured with n input ends and an output end, wherein the n−1 input ends are connected to the output ends of the n−1 first logic gates in the one-to-one correspondence mode, an input end other than the n−1 input ends is configured to receive an n-th state signal, and the second logic gate is configured to perform logic operation on the plurality of input signals to generate the n-th enabling signal.

* * * * *